US012566380B2

(12) United States Patent
Vigen

(10) Patent No.: US 12,566,380 B2
(45) Date of Patent: Mar. 3, 2026

(54) LITHOGRAPHY USING SPIN ISOLATED MONOCHROMATIC ELECTROMAGNETIC RADIATION

(71) Applicant: Eric Arno Vigen, Sherman, TX (US)

(72) Inventor: Eric Arno Vigen, Sherman, TX (US)

( * ) Notice: Subject to any disclaimer, the term of this patent is extended or adjusted under 35 U.S.C. 154(b) by 0 days.

(21) Appl. No.: 19/219,732

(22) Filed: May 27, 2025

(65) Prior Publication Data

US 2025/0362614 A1 Nov. 27, 2025

Related U.S. Application Data

(60) Provisional application No. 63/652,079, filed on May 27, 2024.

(51) Int. Cl.
*G03F 7/20* (2006.01)
*G03F 7/00* (2006.01)

(52) U.S. Cl.
CPC .......... *G03F 7/203* (2013.01); *G03F 7/70008* (2013.01); *G03F 7/70466* (2013.01)

(58) Field of Classification Search
CPC ...... G02B 1/002; G02B 1/007; G02B 21/004; G02B 21/361; G02B 21/367; G02B 27/4261; G02B 27/4266; G02B 27/4277; G02B 3/0043; G02B 3/0056; G02B 3/0062; G02B 3/0068; G02B 5/1876; G02B 5/3083; G02B 27/286; G02B 5/003; G21G 1/12; H01L 23/528; H01L 2924/0002; H01L 2924/00; G21K 1/16; G03F 7/203; G03F 7/70008; G03F 7/70466
See application file for complete search history.

(56) References Cited

U.S. PATENT DOCUMENTS

| | | | |
|---|---|---|---|
| 9,829,717 B1 * | 11/2017 | Walsh | G02B 5/3083 |
| 10,442,688 B1 | 10/2019 | Bailey et al. | |
| 11,774,382 B1 | 10/2023 | Vigen | |
| 2009/0107895 A1 * | 4/2009 | Suzuki | G21K 1/16 |
| | | | 209/638 |
| 2012/0081120 A1 * | 4/2012 | Elgort | G01R 33/282 |
| | | | 324/322 |
| 2014/0138863 A1 * | 5/2014 | Cheng | B29B 9/16 |
| | | | 977/840 |
| 2018/0068572 A1 | 3/2018 | Vigen | |
| 2018/0135883 A1 | 5/2018 | Bailey et al. | |

(Continued)

FOREIGN PATENT DOCUMENTS

| | | | |
|---|---|---|---|
| WO | WO2018236649 A1 | 6/2018 | |
| WO | WO-2024243585 A2 * | 11/2024 | G21G 1/12 |

OTHER PUBLICATIONS

Vigen, A. (Apr. 17, 2024). Hemispherical Atomic Model ISBN 9798870681290.

(Continued)

*Primary Examiner* — Deoram Persaud
(74) *Attorney, Agent, or Firm* — Cooper & Associates; Mark L. Cooper

(57) ABSTRACT

A method including contacting for a period of time, and at a temperature, a portion of an uncured layer of a polymeric composition disposed over a substrate with a spin isolated beam of monochromatic electromagnetic radiation having a wavelength and an intensity sufficient to activate and at least partially cure the portion of the polymeric composition is disclosed herein.

20 Claims, 3 Drawing Sheets

(56) References Cited

U.S. PATENT DOCUMENTS

| | | | |
|---|---|---|---|
| 2018/0350477 A1 | 12/2018 | Vigen | |
| 2019/0215069 A1* | 7/2019 | Romanato | G02B 6/2848 |
| 2019/0392112 A1 | 12/2019 | Vigen | |
| 2025/0012743 A1* | 1/2025 | Vigen | H01J 37/244 |

OTHER PUBLICATIONS

Vigen, A. (Dec. 23, 2023). The Nature and Causation of Light, Photons, and EM Waves Amazon-ASIN B0CQWN1NT4.

Vigen, A. (Mar. 1, 2024). First Principles for Subatomic Physics Amazon-ASIN: B0CWTYVX7Q.

Vigen, A. (Jan. 28, 2023). HemiQuantum Physics: Resolving Each Quantum Dilemma: Improving Each Quantum Technique from Planck's Equation to Elementary Particles, Amazon-ASIN B0BTC7PGND.

Vigen, A. (Jan. 19, 2019). Understanding Pauli's ½ as 3D Hemispheres Fully Links Quantum Theory to Classical Physics, Amazon-ASIN B07MYNTPJ7.

Vigen, A. (Jan. 18, 2019). Simple Words to Fully Reconcile Classical Mechanics with Quantum Theory, Amazon-ASIN B07MY9CH4F.

Vigen, A. (Apr. 25, 2022). Refining the Schrödinger Wave Function Equation in Hemispherical $(r,\theta,\varphi,z=X0=\pm\frac{1}{2})$ Coordinates Amazon-ASIN B09YWSL1FR.

Vigen, A (Oct. 12, 2016). Gravity is Just That Electrons are a Little Closer; Amazon-ASIN B01M9B4V4E.

Vigen. A (Oct. 13, 2016). Electron Shell Chemistry is Just Scrunched Cube Geometry; Amazon-ASIN B01M7PRGWZ.

Vigen, A (Jan. 19, 2019). Revising Planck-Einstein Energy Equation to Add Pauli's ½ Fully Links Quantum Theory to Classical Physics; Amazon-ASIN(B07MYLTJ67).

Vigen. A (Jan. 18, 2018). Postulated Nucleostaticmagnetics Force for Subatomic Particles Resolves Dirac's 1931 Monopoles as Fully Deterministic Duopoles; Amazon-ASIN B07MY7F289.

Vigen, A. (Mar. 25, 2023). The Mass Equation: My Breakthrough Position-in-Field Approach from Hemispherical $(r,\theta,\varphi,z=X0=\pm\frac{1}{2})$; Amazon-ASIN B0BZN3MGNC.

Vigen, A. (Oct. 2, 2020). Replacement of Bohr's Angular Momentum with Strong Nuclear Force for Electrons; Amazon-ASIN B08KNMVPB1.

Vigen, A (Jun. 20, 2020). Nucleostaticmagnetics Vector Equations; Amazon-ASIN B08BKW46GG.

Vigen, A. (Mar. 2, 2020). Math Integrity Understanding Strong and Weak Force Through the Forces / Fields of Electrostatic, Direct and Axial Nucleostaticmagnetics: 4-Vector in 3D Model Generating Four Quantum Equations (Dirac); Amazon-ASIN B085R99M44.

Vigen, A. (Jan. 18, 2020). Renaissance Physics: Understanding Post-Quantum Novo-Classical Subatomic Particle Engineering Textbook Chapter 1-4 Amazon ISBN 1659185777.

Vigen, A. (Mar. 31, 2019). 3D Visual Chemistry Textbook; Amazon-ASIN B07Q3PY8GV.

Vigen, A. (Jan. 18, 2018). Quantum Entanglement, Wave Functions, and Spectrum Given the 3D Arno Vigen Scrunched Cube (AVSC) Atomic Model; Amazon-ASIN B07MY7Y5ZW.

Vigen, A. (Oct. 8, 2017). Fixing Einstein's E=mc-squared: Replacing Observed Mass ('m') with the 'M' Nucleus Magnetic Force Divided by the Volume of the Electron Shell Radius Separation; Amazon-ASIN B0769ZJK9K.

Vigen, A. (Oct. 29, 2016). Why Does a Nucleus Stay Together When Protons (+) Repel Each Other?: A Nucleus is Just . . . a Magnetic Chain-Ring; Amazon-ASIN B01M73KXNQ.

Why and How Deterministic Subatomic Physics Causes Quantum Statistics, Theory, ISBN: 9798282301441.

\* cited by examiner

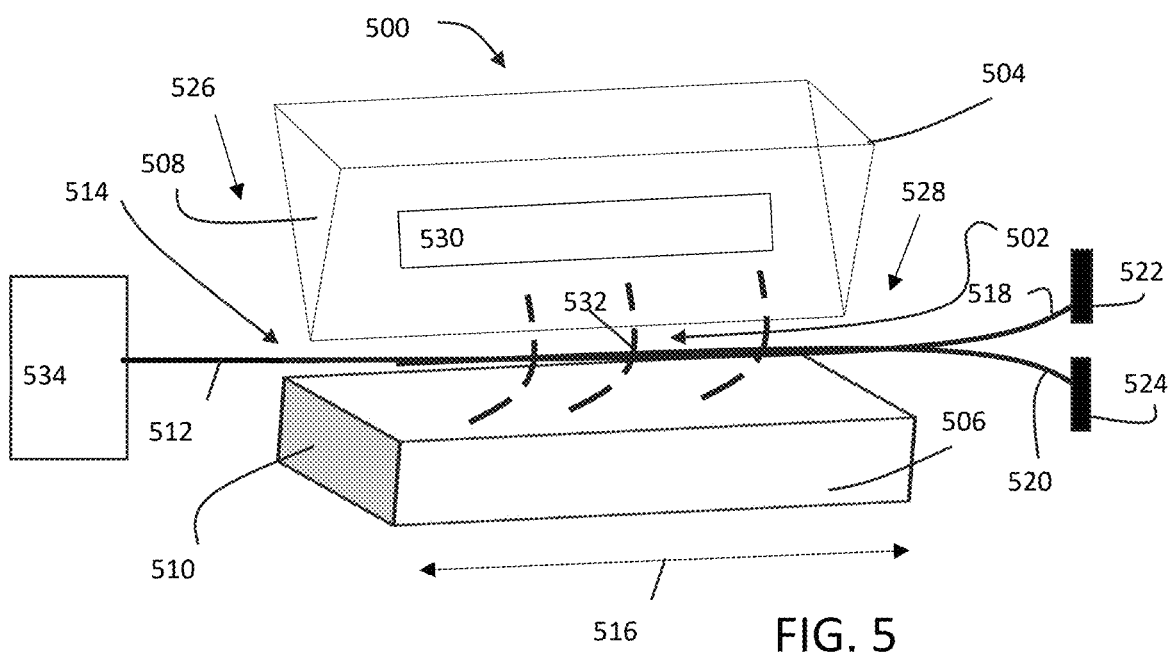
FIG. 5
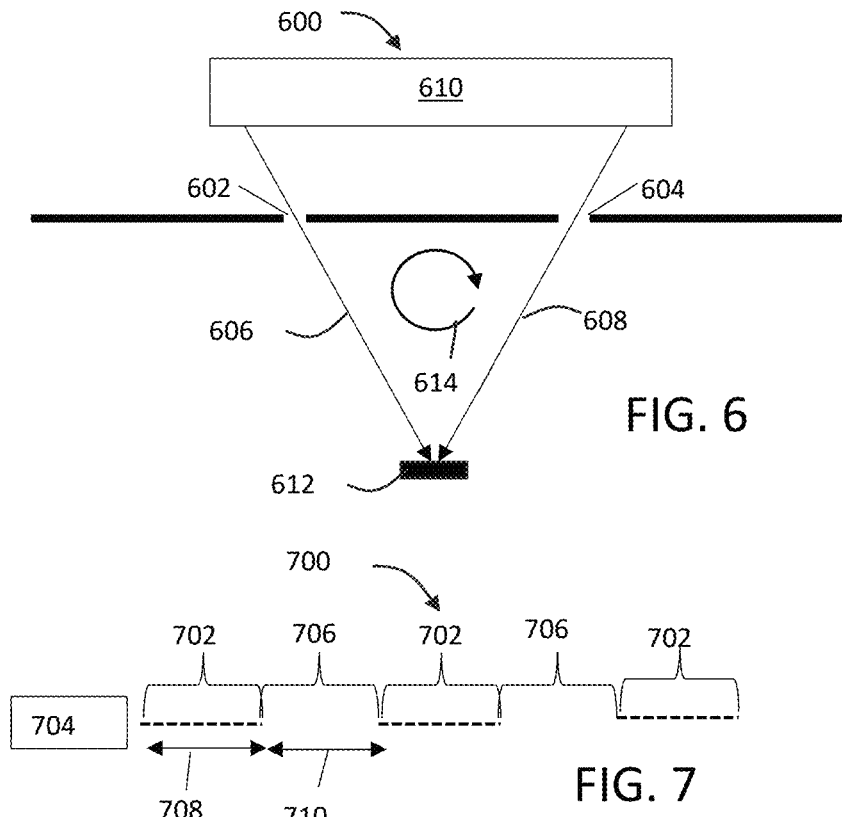
FIG. 6
FIG. 7

1

LITHOGRAPHY USING SPIN ISOLATED MONOCHROMATIC ELECTROMAGNETIC RADIATION

RELATED APPLICATIONS

This application claims priority to U.S. Provisional Patent Application 63/652,079, filed May 27, 2024, the contents of which are incorporated by reference herein.

FIELD

Embodiments of the present disclosure generally relate to lithograph using an electromagnetic energy beam comprising spin-isolated particles. More specifically to a lithographic process utilizing an electromagnetic energy beam comprising spin-isolated photons and a substrate produced using the same.

BACKGROUND

Lithography is the process of transferring patterns of geometric shapes in a mask to a thin layer of radiation-sensitive material referred to as a resist, covering the surface of a semiconductor wafer. Lithographic processes are employed in semiconductor substrate fabrication. Lithography includes transmitting and/or reflecting a beam of electromagnetic radiation through or off of a mask which the exposes the photoresist rendering it insoluble in the developer solution, thereby enabling the direct transfer of the mask pattern onto the wafer. Other embodiments include photoresists which when contacted by the beam of electromagnetic radiation rendering the photoresist soluble in the developer solution, thereby enabling the direct transfer of the mask pattern onto the wafer. After the patterns are defined, an etching process is employed to selectively remove masked portions of the underlying layer. The performance of a lithographic exposure is determined by three parameters: resolution, registration, and throughput.

Resolution is defined as the minimum feature dimension that can be transferred with high fidelity to a resist film on a semiconductor wafer. Registration is a measure of how accurately patterns on successive masks can be aligned or overlaid with respect to previously defined patterns on the same wafer. Throughput is the number of wafers that can be exposed per hour for a given mask level and is thus a measure of the efficiency of the lithographic process. Electromagnetic (EM) waves are formed from a plurality of individual particles. In photo lithography, these individual particles are photons.

The electromagnetic radiation directed at a photoresist to affect a change in the photoresist, e.g., curing, to impart a pattern on a semiconductor substrate used in further processing to produce a semiconductor is prone to scattering due to the random nature of EM waves. To overcome the well known uncertainty principal when performing a specific tasks includes relativity high energy and varied exposure or interactions to ensure a monochromatic electromagnetic radiation beam having the precise energy level necessary to affect an intended change strikes a target located at a point in space. The inventor has observed that using monochromatic electromagnetic radiation beams in a precise way, e.g., in computer chip lithography, requires the source to have a relatively high energy levels, e.g., extreme ultraviolet (UVL) light to affect the necessary changes at the spatial resolution required in semiconductors. Furthermore, it has been observed that this excess energy has unintended effects which can be detrimental to the end product. There is a need to improve the spatial resolution and control over the nature of beams of monochromatic electromagnetic radiation beam waves utilized in various processes.

SUMMARY

Methods and apparatus for lithography using a spin isolated beam of monochromatic electromagnetic radiation are provided herein. In some embodiments, a method comprises contacting for a period of time, and at a temperature, a portion of an uncured layer of a polymeric composition disposed over a substrate with a spin isolated beam of monochromatic electromagnetic radiation having a wavelength and an intensity sufficient to activate and at least partially cure the portion of the polymeric composition; wherein the spin isolated beam of monochromatic electromagnetic radiation consists essentially of a plurality of spin isolated photons, wherein the spin isolated photons are only observable within a plurality of first discrete ranges along a path of the spin isolated beam of monochromatic electromagnetic radiation, each of the first discrete ranges centered at a corresponding distance from a source of the spin isolated beam of monochromatic electromagnetic radiation, wherein essentially no photons are observable within a plurality of second discrete ranges located in-between each of the first discrete ranges along the path of the spin isolated beam of monochromatic electromagnetic radiation.

In embodiments, the spin isolated beam of monochromatic electromagnetic radiation is produced by directing a monochromatic electromagnetic radiation beam having the wavelength through one or more spin isolation filters.

In embodiments, a substrate comprises an uncured portion and a cured portion of a layer of a polymeric composition disposed over the substrate, wherein the portion of cured portion of the layer of the polymeric composition is formed by contacting the portion of the polymeric composition for a period of time and at a temperature with a spin isolated beam of monochromatic electromagnetic radiation having a wavelength and an intensity sufficient to activate and at least partially cure the portion of the polymeric composition; wherein the spin isolated beam of monochromatic electromagnetic radiation consists essentially of a plurality of spin isolated photons, wherein the spin isolated photons are only observable within a plurality of first discrete ranges along a path of the spin isolated beam of monochromatic electromagnetic radiation, each of the first discrete ranges centered at a corresponding distance from a source of the spin isolated beam of monochromatic electromagnetic radiation, wherein essentially no photons are observable within a plurality of second discrete ranges located in-between each of the first discrete ranges along the path of the spin isolated beam of monochromatic electromagnetic radiation.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 5 is a block diagram depicting a magnetic spin isolation filter according to embodiments disclosed herein.

FIG. 6 is a block diagram depicting another embodiment of a magnetic spin isolation filter according to embodiments disclosed herein.

FIG. 7 is a diagram depicting a spin isolated monochromatic electromagnetic beam according to embodiments disclosed herein.

Figure 1:
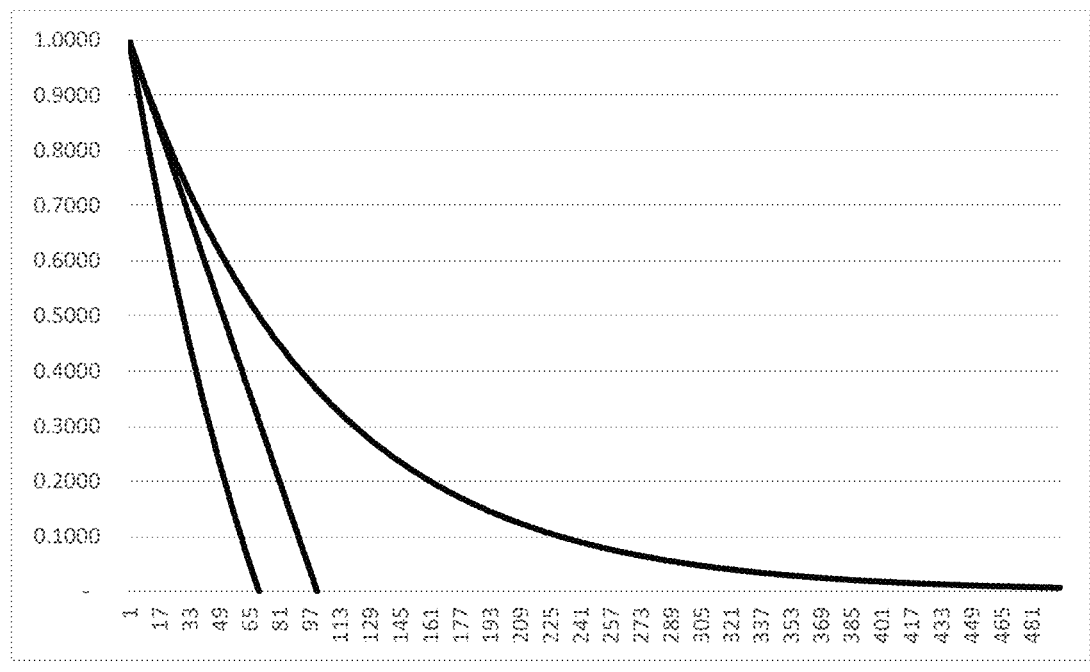
FIG. 1 depicts a graph showing the difference between an irradiation of a substrate according to embodiments disclosed herein, and a prior art statistical irradiation of the substrate.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments disclosed herein include reference to a hemispherical model which provides physical modelling of the underlying chemistry and subatomic physics using hemispherical coordinates $(r,\theta,\varphi,z=X0=\pm\frac{1}{2})$, and replacing quantum numbers (n,l,ml,ms). The hemispherical model (referred to herein as the HemiChem Model) further utilizes acceleration allocation (aa) replacing Newton's $2^{nd}$ Law of Motion wherein three core interactions are utilized to generate the fundamental forces, including full integration of gravity.

For purposes herein, elementary particles are considered to be elementary-event sets of multiple core particles, arranged in three dimensional (3D) engineering stable structures. The Hemichem model provides 3D engineering and physical, classical physics causation for each of prior art quantum equations. The statistical techniques remain valid for the multiple particles and multiple events where a single event or particle cannot be observed according to methods currently known. Using the Hemichem model, each quantum equation is improved by incorporating and additional frame-of-reference. Various known dilemmas, such as improper infinities, are likewise resolved and quantum techniques become redundant.

However, the Hemichem method referred to herein does not detract from, and is in overall agreement with the multitude of information readily known to one of skill in the art of quantum mechanics (QM), quantum field theory (QFT), and the like. Instead, the Hemichem method utilized herein presents revisions to known relationships which bridge classical single particle-particle events-sets with the multiple-event quantum prediction techniques and experimental evidence.

A detailed description of the methods and models utilized herein, including the HemiChem model, may be found in the HemiChem IDS series including Vigen, A. (4-17-2024). *Hemispherical Atomic Model* ISBN 9798870681290, Vigen, A. (12-23-2023). *The Nature and Causation of Light, Photons, and EM Waves* Amazon-ASIN B0CQWN1NT4; Vigen, A. (3-1-2024). *First Principles for Subatomic Physics* Amazon-ASIN: B0CWTYVX7Q; and the like. Additional references include Vigen, A. (1-28-2023). *HemiQuantum Physics: Resolving Each Quantum Dilemma: Improving Each Quantum Technique from Planck's Equation to Elementary Particles*, Amazon-ASIN B0BTC7PGND; Vigen, A. (1-19-2019). *Understanding Pauli's ½ as 3D Hemispheres Fully Links Quantum Theory to Classical Physics*, Amazon-ASIN B07MYNTPJ7; Vigen, A. (1-18-2019). *Simple Words to Fully Reconcile Classical Mechanics with Quantum Theory*, Amazon-ASIN B07MY9CH4F; Vigen, A. (4-25-2022). *Refining the Schrödinger Wave Function Equation in Hemispherical* $(r,\theta,\varphi,z=X0=\pm\frac{1}{2})$ *Coordinates* Amazon-ASIN B09YWSL1FR; Vigen, A (10-12-2016). *Gravity is Just That Electrons are a Little Closer*, Amazon-ASIN B01M9B4V4E; Vigen. A (10-13-2016). *Electron Shell Chemistry is Just Scrunched Cube Geometry*; Amazon-ASIN B01M7PRGWZ; Vigen. A (1-19-2019). *Revising Planck-Einstein Energy Equation to Add Pauli's ½ Fully Links Quantum Theory to Classical Physics*; Amazon-ASIN (B07MYLTJ67); Vigen. A (1-18-2018). *Postulated Nucleostaticmagnetics Force for Subatomic Particles Resolves Dirac's* 1931 *Monopoles as Fully Deterministic Duopoles*; Amazon-ASIN B07MY7F289; Vigen. A (3-25-2023). *The Mass Equation: My Breakthrough Position-in-Field Approach from Hemispherical* $(r,\theta,\varphi,z=X0=\pm\frac{1}{2})$; Amazon-ASIN B0BZN3MGNC; Vigen A. (10-2-2020). *Replacement of Bohr's Angular Momentum with Strong Nuclear Force for Electrons*; Amazon-ASIN B08KNMVPB1; Vigen, A (6-20-2020). *Nucleostaticmagnetics Vector Equations*; Amazon-ASIN B08BKW46GG; Vigen, A. (3-2-2020). *Math Integrity Understanding Strong and Weak Force Through the Forces/Fields of Electrostatic, Direct and Axial Nucleostaticmagnetics: 4-Vector in 3D Model Generating Four Quantum Equations (Dirac)*; Amazon-ASIN B085R99M44; Vigen, A. (1-18-2020). *Renaissance Physics: Understanding Post-Quantum Novo-Classical Subatomic Particle Engineering Textbook Chapter* 1-4 Amazon ISBN 1659185777; Vigen, A. (3-31-2019). *3D Visual Chemistry Textbook*; Amazon-ASIN B07Q3PY8GV; Vigen, A. (1-18-2018). *Quantum Entanglement, Wave Functions, and Spectrum Given the 3D Arno Vigen Scrunched Cube (AVSC) Atomic Model*; Amazon-ASIN B07MY7Y5ZW; Vigen, A. (10-8-2017). *Fixing Einstein's E=mc-squared: Replacing Observed Mass ('m') with the 'M' Nucleus Magnetic Force Divided by the Volume of the Electron Shell Radius Separation*; Amazon-ASIN B0769ZJK9K; Vigen, A. (10-29-2016). *Why Does a Nucleus Stay Together When Protons(+) Repel Each Other?: A Nucleus is Just . . . a Magnetic Chain-Ring*; Amazon-ASIN B01M73KXNQ; Why and How Deterministic Subatomic Physics Causes Quantum Statistics, Theory, ISBN: 9798282301441; and Rules for a Powerful, Defendable Hypothesis ISBN: 9798311285568. The full disclosures of which are fully incorporated by reference herein.

As used herein, radial electrostatic (rES) interaction/force refers to an electrostatic (ES) attribute often referred to as charge in the prior art, having an appropriate sign of positive (+) or negative (−). For use herein, rES may also be referred to as rzE. Radius xtrastatic (rXS) may also be referred to as "rzX". Description directed to towards-the-axis magnostatic, referred to herein as axial xtrastatic (aXS), may also be referred to via polar coordinates "rho"zM. The operating rules associated with radial electrostatic (rES) interaction is that opposites attract and like-kind repel.

Xtrastatic (XS) axis refers to the axis inherent in every subatomic particle according to the hemichem model, and may also be referred to as directed along the z-axis (zenith). Xtrastatic interactions may also be referred to as magnostatic interaction.

Axial extrastatic interaction and/or force refers to the attractive force from a particle (P1), or more specifically from its two hemispheres/poles, towards the axis of a second particle (P2). The sign of the interaction being based upon the XS-attribute known as mass in prior art.

Radial extrastatic interaction and/or force refers to the repulsive force from a particle (P1) from its two differentiate axis/hemispheres away from a second particle (P2). This sign of this interaction is based upon the XS-attribute also referred to a mass in prior art.

In addition, it is understood that like-kind particles do not have xtrastatic interactions. Only the electron-proton, and the electron-nucleon have two xtrastatic interactions.

For purposes herein, consistent with the Hemichem model, particle-edge and maximum field strength occurs at a particle's physical dimension radius, which corresponds to the Bohr radius, abbreviated herein as ($a_o$). Accordingly, for purposes herein, a proton is assumed to have a radius and position-in-field maximum at $a_o=r_e$.

For purposes herein, calculation of the behavior of each hemisphere is defined from pole to equator by that inherent XS axis over the body of particle. The body of particle having a center-of-substance defined in hemispherical coordinates $(r,\theta,\varphi,z=X0=\pm\frac{1}{2})$ as $((3/8)r,0,0,-\frac{1}{2})$ for a first hemisphere, and $((3/8)r,0,0,-\frac{1}{2})$ for the other second hemisphere, which is locked-at-180° relative to the first hemisphere.

In embodiments, spin isolated beam of monochromatic electromagnetic radiation is formed from an EM wave which is separated into a set of isolated EM waves, i.e., a spin isolated beam of monochromatic electromagnetic radiation, each particle present in the spin isolated beam of monochromatic electromagnetic radiation having essentially the same physics-spin and polarity, which then may be utilized for various commercial applications.

In embodiments, a method comprises contacting for a period of time, and at a temperature, a portion of an uncured layer of a polymeric composition disposed over a substrate with a spin isolated beam of monochromatic electromagnetic radiation having a wavelength and an intensity sufficient to activate and at least partially cure the portion of the polymeric composition; wherein the spin isolated beam of monochromatic electromagnetic radiation consists essentially of a plurality of spin isolated photons, wherein the spin isolated photons are only observable within a plurality of first discrete ranges along a path of the spin isolated beam of monochromatic electromagnetic radiation, each of the first discrete ranges centered at a corresponding distance from a source of the spin isolated beam of monochromatic electromagnetic radiation, wherein essentially no photons are observable within a plurality of second discrete ranges located in-between each of the first discrete ranges along the path of the spin isolated beam of monochromatic electromagnetic radiation.

In embodiments, the spin isolated beam of monochromatic electromagnetic radiation is linearly polarized, circularly polarized, elliptically polarized, or a combination thereof. In embodiments, the spin isolated beam of monochromatic electromagnetic radiation is configured such that only photons having a positive spin are present within a plurality of particular first discrete ranges N, and only photons having a negative spin are present within a plurality of second discrete ranges (N+1) along the path of the spin isolated beam of monochromatic electromagnetic radiation.

In embodiments, the spin isolated monochromatic electromagnetic beam is directed through, or reflected off of a mask, configured to activate only a portion of the polymeric composition disposed over the substrate. In embodiments, a distance between a source of the spin isolated beam of monochromatic electromagnetic radiation and the substrate is selected such that photons generated by multiple photon sources present within the source each having the same spin, are present within a particular first discrete range centered at a particular discrete location along the path of the spin isolated beam of monochromatic electromagnetic radiation, such that only a specified portion of the polymeric composition which is present on a surface of the substrate at the particular discrete location is activated and cured.

In embodiments, the contacting the portion of the uncured layer of the polymeric composition further comprises contacting a first portion of the uncured polymeric composition with the spin isolated beam of monochromatic electromagnetic radiation to activate and cure a first portion of the polymeric composition, followed by changing a distance between the source of the spin isolated beam of monochromatic electromagnetic radiation and the substrate, followed by contacting a second portion of the uncured layer of the polymeric composition with the spin isolated beam of monochromatic electromagnetic radiation to activate and cure a second portion of the polymeric composition. In embodiments, the spin isolated beam of monochromatic electromagnetic radiation has a wavelength from about 0.01 nm to about 800 nm.

In embodiments, the spin isolated beam of monochromatic electromagnetic radiation is produced by directing a monochromatic electromagnetic radiation beam having the wavelength through one or more spin isolation filters. In embodiments, the spin isolation filter comprises a double slit-single slit spin isolation filter comprising two coplanar slits disposed through a first wave barrier, and a second single slit disposed through a second wave barrier spaced away from first wave barrier along a path of the monochromatic electromagnetic radiation beam through the spin isolation filter, wherein each of the two coplanar slits have a slit width (S); wherein the two coplanar slits are separated center-on-center by a slit distance (d); and wherein the method includes: directing at least a portion of the monochromatic electromagnetic radiation beam through the two coplaner slits, and directing a portion of the monochromatic electromagnetic beam emanating from one of the two coplanar slits through the second single slit disposed through the second wave barrier oriented parallel to the first wave barrier, to form the spin isolated beam of monochromatic electromagnetic radiation emanating from the second single slit; wherein the second wave barrier is located a barrier distance D from the first wave barrier along the path of the beam, wherein $D=((n/2)/d)*$the wavelength; and wherein n is an odd integer divided by 2 (n/2).

In embodiments, the slit distance (d) is greater than or equal to about eight times the slit width S according to the equation:

$$d=8S\pm5\%.$$

In embodiments, a power or intensity of the spin isolated beam of monochromatic electromagnetic radiation contacting the portion of the uncured layer of the polymeric composition d is essentially equal in intensity to the intensity of the spin isolated beam of monochromatic electromagnetic radiation emanating from the second single slit.

In embodiments, the spin isolation filter comprises a magnetic spin isolation filter, comprising: a beam inlet separated from a beam outlet along a beam path disposed between a first magnet and a second magnet, wherein the beam path is oriented through a non-uniform magnetic field disposed between the first magnet having a first cross section oriented perpendicular to the beam path and a second magnet having a second cross section oriented perpendicular to the beam path which is different than the first cross section, the first magnet and second magnet configured such that the beam path between the beam inlet and the beam outlet of the magnetic spin isolation filter transverses a non-uniform magnetic field; the first magnetic and the second magnet having a strength and the beam path having a length sufficient to separate the monochromatic electromagnetic radiation beam into a pair of spin isolated beam of monochromatic electromagnetic radiation, each independently emanating from different portion of the beam outlet; and wherein the method further includes directing the monochromatic electromagnetic radiation beam having the wavelength through the beam inlet under conditions sufficient to produce the spin isolated beam of monochromatic electromagnetic radiation emanating from the beam outlet.

In embodiments, a substrate comprising an uncured portion and a cured portion of a layer of a polymeric composition disposed over the substrate, wherein the portion of cured portion of the layer of the polymeric composition is formed according to one or more embodiments disclosed herein.

In embodiments, the spin-isolated monochromatic electromagnetic beam is configured such that only photons from multiple sources, each having the same spin, are present within a particular first discrete range centered at a particular discrete location along the path of the monochromatic electromagnetic beam.

In embodiments, each first discrete range is located at a corresponding entanglement observation node distance, determined from formula I:

$$\lambda = \Delta\ D_{node} = D_{node2} - D_{node1} = D_{node}\left(1/(V_{N1})^2 - 1/(V_{N2})^2\right); \qquad \text{(I)}$$

wherein:

$\lambda$ is a wavelength of the spin-isolated monochromatic electromagnetic beam;

$\Delta D_{node}$ is a linear distance between a center of a particular first discrete range $D_{node1}$; and another first discrete range $D_{node2}$ immediately following $D_{node1}$ along the path of the spin-isolated monochromatic electromagnetic beam;

$V_{Nx}$ is an integer subset starting at x=1 determined by formula (II)

$$V_{Nx+1} = V_{Nx} + 1; \qquad \text{(II)}$$

wherein each V and x are determined independently, as integers greater than or equal to 1, wherein $D_{node}$ is a base node distance determined by formula (III):

$$D_{node} = 6r_e\left((d/(6\ r_e))^2 - 1\right); \qquad \text{(III)}$$

wherein:

$r_e$ is the radius of an electron;

d is a distance between a center of a nucleus and a center of an electron of the atom of the source of the electromagnetic beam.

Without wishing to be bound by theory, the inventor believes that the characteristics of the spin-isolated monochromatic electromagnetic beam, i.e., wherein the spin-isolated monochromatic electromagnetic beam consists essentially of a plurality of spin-isolated photons, only observable within a plurality of first discrete ranges along a path of the monochromatic electromagnetic beam, each of the first discrete ranges centered at a corresponding distance from a source of the monochromatic electromagnetic beam, and wherein essentially no photons are observable within a plurality of second discrete ranges located in-between each of the first discrete ranges, allows for the irradiation of a particular portion of a substrate, and only the particular portion of the substrate present with each of the first discrete ranges of the spin-isolated monochromatic electromagnetic beam Accordingly, utilizing the spin-isolated monochromatic electromagnetic beam allows for selective irradiation and/or activation of a target substrate instead of a random, statistical approach currently required, in which other portions of a substrate are unintentionally irradiated and/or activated.

In embodiments, the dimensions of the source of the monochromatic electromagnetic beam may be configured, manipulated, and/or controlled to select the portion of a target substrate irradiated thereby. In embodiments, a distance between source and the target may be configured, manipulated, and/or controlled to select the portion of a target substrate irradiated thereby.

In embodiments, the wavelength of the source of the monochromatic electromagnetic beam may be configured, manipulated, and/or controlled to select the portion of a target substrate irradiated thereby.

FIG. 1 depicts the timeframe difference of an activation e.g., irradiation of a particular portion of a substrate, when conducted utilizing statistical process versus fully systematic engineering utilizing a spin-isolated monochromatic electromagnetic energy beam according to embodiments herein, compared to a statistical approach utilizing a monochromatic electromagnetic energy beam which is not spin isolated. For a process utilizing a spin isolated monochromatic electromagnetic energy beam that would process a substrate in fifty (50) exposure cycles, a comparable statistical process would require an essentially infinite time. As FIG. 1 shows, wherein the x-axis is "exposure cycles" and y-axis is "unexposed fraction remaining", for a process according to embodiments disclosed herein which is essentially 100% complete in 100 cycles, 50% of the same process is completed at 50 cycles. In contrast, a statistical, random process which does not utilize a spin-isolated monochromatic electromagnetic energy beam according to embodiments never completes, and at 500 cycles 1% of the intended result of the statistical process remains.

Figure 2:
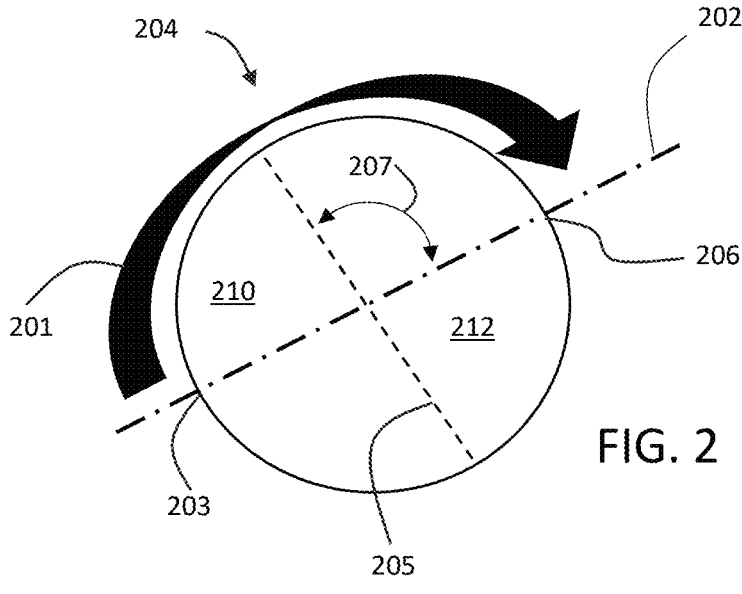
FIG. 2 is a block diagram depicting a subatomic particle according to the HemiChem model according to embodiments disclosed herein.

FIG. 2 depicts a subatomic particle 204 having an xtra-static axis (202) intersecting at two poles, a first pole 203 and a second pole 206. The two hemispheres, a first hemisphere 210 and a second hemisphere 212 are defined by the equator 205 (hashed line) of the particle disposed between the first pole 203 and the second pole 206. According to the Hemi-Chem model, first pole 203 can rotate (arrow 201) from first hemisphere 210 to the opposite second hemisphere 212 such that the first pole 203 is now located at the position previously occupied by the second pole 206, and vice-a-versa. Because these poles are, relative to the nucleus-set, locked-at-180°, the opposite pole (205) would move to the opposite pole original position (203).

The rotation of the hemispheres either occurs to produce energy in the form of an electromagnetic wave or requires absorption of energy of a particular wavelength. A causation-source structure is defined by a polarity angle (207), specified as latitude (?) relative to the radial, direct line of travel (r) defining the wavelength from the square of distance between the electron. Further, energy of this event become the ($\varepsilon$=hv) in the Planck relation. Polarity angle 207 ($\varphi$) is related to the conditions required for causation of the flipping of the two poles since an orientation of the polarity angle 207 resultant from a source electron-proton interaction providing energy for the event to occur must reasonably match the target's axis orientation for such a transfer of energy to occur.

The EM wave/photon generated by a causation-source electron to effect a rotation of the first pole 203 from the first hemisphere 210 to the opposite second hemisphere 212 such that the first pole 203 is now located at the position previously occupied by the second pole 206, maintains that orientation (polarity) and rotational direction (physics-spin).

In embodiments utilizing a modified double slit spin isolation filter, a double slit arrangement is utilized, which is modified to include an additional single slit located in a dark band of the light emanating from one of the double slits. An actuation position, e.g., a position on or in a substrate to be irradiated, is adjusted to put the particular position within an entanglement node location of the spin isolated monochromatic electromagnetic beam.

Figure 3:
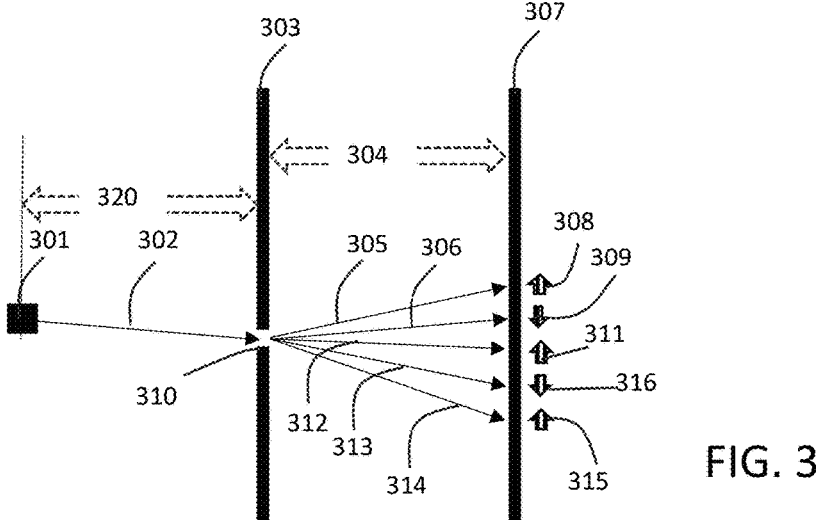
FIG. 3 is a block diagram depicting the effect of a monochromatic electromagnetic beam transversing a single slit according to the HemiChem model according to embodiments disclosed herein.

As depicted in FIG. 3, when a monochromatic electromagnetic radiation beam, e.g., a light beam, passes through a single slit, the beam will be split horizontally via interaction of the photons with the closer mass of a slit edge causing the a monochromatic electromagnetic radiation beam to spread out e.g., into an ellipsoid pattern, instead of proceeding in a straight line. The EM waves present in the monochromatic electromagnetic radiation beam do not experience the spreading and maintain the relatively, effectively straight line behavior vertically except for the portion of the beam interacting with the bottom of the beam. The end result of a monochromatic electromagnetic radiation beam directed through a slit is spreading horizontally, but no spreading vertically to produce an interference pattern. However, because of those distances, the pattern is not just horizontal spreading, which has a smooth gradient from center to the widths. Instead, the inventor has observed that because the distances traveled by the beam are different, the spreading of the photons results from different physics-spin orientations. However, the different physics spins are not observed because they are either 'up' or 'down' and do not produce bright line banding.

As FIG. 3 shows, a monochromatic electromagnetic radiation beam source 301 produces an electromagnetic energy beam 302 comprising a stream of photons, separated a first distance 320 from a barrier 303. The photons are directed towards barrier 303 having a vertical slit 310 disposed therethrough. The portion of the electromagnetic energy beam 302 which proceeds through the vertical slit 310 spreads out indicated by beams 305, 306, 312, 313 and 314, which then arrive at a receiver 307 separated from barrier 303 by a second distance 304. As indicated by the up and down arrows, the beams 305, 306, 312, 313 and 314, arrive at receiver 307 having different physics spin based upon the overall distance the particular beam travels, wherein beams arrive having alternative physics-spin amplitudes wherein beam 305 has an up physics spin indicated by arrow 308, beam 306 has a down physics spin indicated by arrow 309, beam 312 has an up physics spin indicated by arrow 311, beam 313 has a down physics spin indicated by arrow 316, and beam 314 has an up physics spin indicated by arrow 315.

By varying the first distance 320, a wavelength of the beam of photons 302, and/or the second distance 304, the physics spin of a particular beam may be manipulated based upon the overall distance the particular beam must travel. In addition, the wavelength of the light may also be manipulated.

Figure 4:
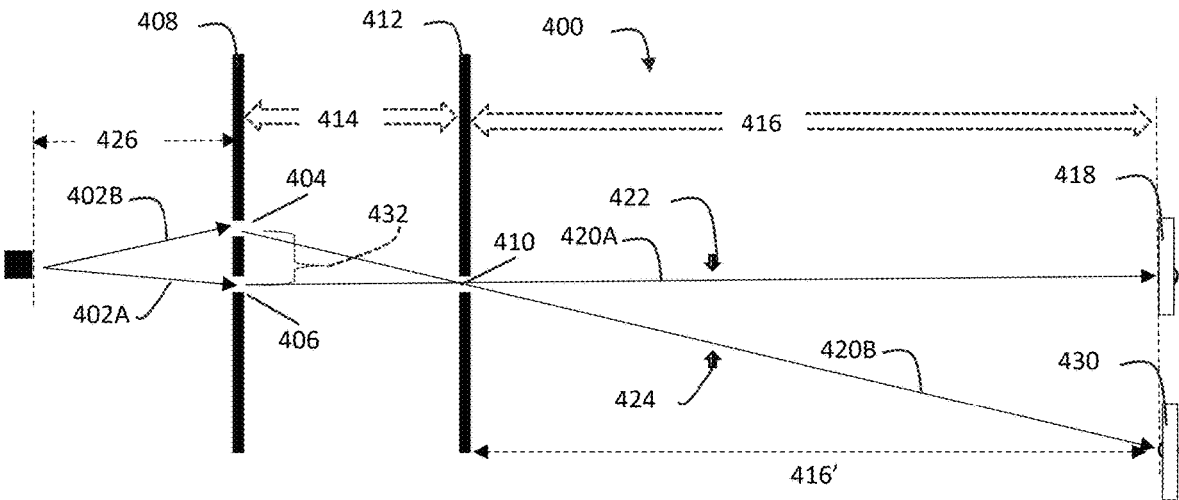
FIG. 4 is a block diagram depicting a modified double slit spin isolation filter according to embodiments disclosed herein.

FIG. 4 depicts a modified double-slit spin isolation filter 400 according to embodiments disclosed herein. In embodiments, monochromatic electromagnetic beams 402A and 402B having a wavelength ($\lambda$) is produced from a source 428 and directed through two coplanar slits 404 and 406 disposed through a first wave barrier 408. A third slit 410 is disposed through a second barrier 412. A spin isolated monochromatic electromagnetic beam 420A produced from the monochromatic electromagnetic beam 402A emanates from third slit 410. Likewise, a spin isolated monochromatic electromagnetic beam 420B produced from the monochromatic electromagnetic beam 402B also emanates from third slit 410 along a different path.

As the monochromatic electromagnetic beams 402A and 402B arrive at the first barrier 408 and pass through the corresponding slits 404 and 406, an interference pattern is produced on the second barrier 412 separated from the first barrier 408 by a second distance 414, as is known in the art. However, it is believed that the alternating light band-dark band interference pattern produced on the second barrier 412 is the result of overlapping of the physics spins shown in FIG. 4 and not some wave property of the photons.

In embodiments, the position of third slit 410 is located within a dark band of the pattern of light and dark bands produced on the second barrier 412. Ostensibly, no photons are present in this region. However, the inventor has discovered that indeed photons are present in this region, they are simply not observable in this region due to interference between different beams, each having a particular spin isolation.

A first target substrate 418 is located at a target distance 416 from the second barrier 412. The spin isolated monochromatic electromagnetic beam 420A has a physics-spin arbitrarily labeled 'down' (arrow 422) in this example. The spin isolated monochromatic electromagnetic beam 420B has a physics-spin arbitrarily labeled 'up' (arrow 424) in this example.

In embodiments, a plurality of second target substrates 430 (only one of which is shown for simplicity) may be arranged to intersect another spin isolated monochromatic electromagnetic beam 420B at a second target distance 416', which in embodiments may be located at the first target distance 416.

The spin isolated monochromatic electromagnetic beams 420A and 420B each independently consist essentially of a plurality of spin-isolated photons. These spin-isolated photons are only observable within a plurality of first discrete ranges along a path of the monochromatic electromagnetic beam, each of the first discrete ranges is centered at a corresponding distance from a source of the monochromatic electromagnetic beam. The spin isolated monochromatic electromagnetic beams are further characterized as having a plurality of second discrete ranges located in-between each of the first discrete ranges wherein essentially no photons are observable. Accordingly, only the portion of the target substrate 418 located at the target distance 416 is irradiated with the photons present in the spin isolated monochromatic electromagnetic beam at the corresponding first discrete range. Any portion of the first target substrate 418 which is not present within this first discrete range is not irradiated with the photons present in the spin isolated monochromatic electromagnetic beam. Accordingly, in embodiments, the target distance 416 may be controlled and/or modified to provide spatial resolution of irradiation or other types of activation on or of the target substrate by the spin isolated monochromatic electromagnetic beam.

In embodiments, the target distance 416 is selected, modified, controlled and/or configured such that photons of the spin isolated monochromatic electromagnetic beam 420A irradiate, activate, and/or interact with the portion of the first target substrate to be irradiated, allowing the intended result of that irradiation e.g., photocatalytic curing of a mask, only in the region irradiated.

It is noted that the prior art use of the terms 'up' and 'down' to describe spin is imprecise or misleading. An 'up' spin of a spin isolated monochromatic electromagnetic beam is more completely described as having an inner-clockwise/outer-counterclockwise spin, and a 'down' spin of a spin isolated monochromatic electromagnetic beam is more completely described as inner-counterclockwise/outer-clockwise with the center as the same node. Accordingly, consistent with current understanding, photons and monochromatic electromagnetic radiation beams possess dual wave characteristics (See Vigen, A. (12-24-2023). *The Nature and Causation of Light Amazon-ASIN B0CQXD14QN*).

Each spin isolated monochromatic electromagnetic beam arriving at a barrier will show a pattern of alternating light bands where photons are observable and dark bands in which intermediate positions are interfering where photons are not observable and thus no activation of a substrate brought about by irradiation with photons will occur.

It is theorized that spin isolated monochromatic electromagnetic beams are produced via spin aggregation of the photons, in which both hemispheres of the subatomic particle, in this case the photon, move in the same direction and thus there is no change in the energy-level associated with the photons present in the spin isolated monochromatic electromagnetic beam.

In embodiments, the portion of the substrate to be activated or irradiated by the photons of the spin isolated monochromatic electromagnetic beam is located in an activation position, which is coincident with an entanglement node of the spin isolated monochromatic electromagnetic beam, where the spin of each photon present is inside one direction and outside the other, resulting in a change in the energy-level for a particular photon, or other subatomic particle i.e., protons and electrons. The rotation energy being the transposition rate of those poles defined by the subatomic particle's axis, with the resulting change in the B-field for perpendicular magnetism linear acceleration according to relationships known in the art.

The use of affecting a change via interaction with a spin isolated monochromatic electromagnetic beam is in contrast to the prior art, which utilizes an excess of photons, in which only a portion of present having the same-physics-spin such that a statistical or probabilistic model must be employed to predict the likelihood of a photon interacting within a particular positional range.

The prior art probability methods of computational chemistry reduce the energy efficiency of any process because only a certain percentage of photons will produce the desired effect. Accordingly, a statistical model must be used since the $2^{nd}$, $3^{rd}$, and Nth photon interactions will be present based on a statistical probability. The result is the exponential 'decay' observed for prior art, based on a quantized statistical chain associated with the function $e^{-x}$. However, the prior art is observed to cause additional waves which cause other, unwanted actuations and events before and beyond the intended target region.

Accordingly, in contrast to the prior art, embodiments disclosed herein provide for delivery of an actuating photon in a designated pattern to a range incrementally for same-physics-spin photons wherein actuations will occur at particular positions and not randomly.

In embodiments, methods disclosed herein have increased energy efficiency because the wavelength and distances may be controlled to optimize the percentage of a particular actuation during a particle irradiation event e.g., during each irradiation pass. Thus embodiments disclosed herein become more mechanical in nature, instead of purely statistical, since $2^{nd}$, $3^{rd}$, Nth processing passes may be adjusted in positions such that a particular portion of a substrate is systematically irradiated with each pass. This is in contrast to a blanket statistical deluge wherein all portions are simultaneously irradiated with unwanted side effects.

In embodiments, a source distance 426 determined between the source 428 and the first barrier 408, the second may be configured, the second distance 414, and the target distance 416 may be configured such that a portion of the first target substrate 418 is irradiated. In addition, the wavelength of the monochromatic electromagnetic beam may be configured, modified and/or controlled such that a portion of the first target substrate 418 is irradiated.

In embodiments, a slit width of each slit is greater than or equal to about one wavelength of the monochromatic electromagnetic beam. In embodiments, the slit width is less than or equal to about 1 mm, or less than or equal to about 0.1 mm, or less than or equal to about 0.001 mm.

In embodiments, a distance between the first and second slits 432 is greater than or equal to about eight times (8×) the wavelength of the monochromatic electromagnetic beam.

As depicted in FIG. 5, in embodiments, the spin isolation filter is a magnetic spin isolation filter 500, comprising a non-uniform magnetic field 502 disposed between an inlet 526 and an outlet 528 of the magnetic spin isolation filter 500. In embodiments, magnetic spin isolation filter 500 includes a first magnet 504 and a second magnet 506, the first magnet 504 having a first cross section 508 oriented perpendicular to a path of the monochromatic electromagnetic beam 512; the second magnet 506 having a second cross 510 oriented perpendicular to the path of the monochromatic electromagnetic beam 512 produced by a source 534, which is different from the first cross section 508, such that the opening 514 between the two magnets 504 and 506 has a non-uniform magnetic field having a magnetic field strength 532 and length 516 in the direction of the path of the monochromatic electromagnetic beam 512 sufficient to separate the monochromatic electromagnetic beam 512 into a pair of spin-isolated electromagnetic energy beams 518 and 520. As shown in FIG. 5, at least one of the spin-isolated electromagnetic energy beams 518 and 520 (or atomic ion beam, not shown) emanating from the outlet 528 interact with a target substrate 522 and 524 to affect actuation or a change of a portion of the target substrate, as described above.

In embodiments, the first magnet 504, the second magnet 510, or both are, or include one or more electromagnetic elements 530 configurable to adjust the magnetic field strength 532 one or more points along the path of the monochromatic electromagnetic beam 512.

As depicted in FIG. 6, in embodiments, the magnetic spin isolation filter 500 is disposed between two or more mirrors 602, 604, and 606, configured to reflect at least a portion of the monochromatic electromagnetic beam back and forth between an inlet and an outlet of the spin isolation filter prior to producing the spin isolated monochromatic electromagnetic beams 518 and 520 from the outlet 528 of the magnetic spin isolation filter 500.

In embodiments, the monochromatic electromagnetic beam is polarized. In embodiments, the monochromatic electromagnetic beam is polarized to be parallel to an axis of a nucleus of an atom present in the source of the monochromatic electromagnetic beam.

In embodiments, the location of each first discrete range wherein the spin-isolated photons are observable is located at a corresponding entanglement observation node distance, determined from formula I:

$$\lambda = \Delta \; D_{node} = D_{node2} - D_{node1} = D_{node}\left(1/(V_{N1})^2 - 1/(V_{N2})^2\right); \qquad \text{(I)}$$

wherein:

$\lambda$ is a wavelength of the spin-isolated monochromatic electromagnetic beam;

$\Delta \, D_{node}$ is a linear distance between a center of a particular first discrete range $D_{node1}$; and another first discrete range $D_{node2}$ immediately following $D_{node1}$ along the path of the spin-isolated monochromatic electromagnetic beam;

$V_{Nx}$ is an integer subset starting at x=1 determined by formula (II)

$$V_{Nx+1} = V_{Nx} + 1; \qquad \text{(II)}$$

wherein each V and x are determined independently, as integers greater than or equal to 1; and wherein $D_{node}$ is a base node distance determined by formula (III):

$$D_{node} = 6r_e\left((d/(6 \, r_e))^2 - 1\right); \qquad \text{(III)}$$

wherein:

$r_e$ is the radius of an electron;

d is a distance between a center of a nucleus and a center of an electron of the atom of the source of the electromagnetic beam.

In embodiments, the spin isolated beam of monochromatic electromagnetic radiation has a wavelength from about 0.01 nm to about 800 nm. In embodiments, the spin isolated beam of monochromatic electromagnetic radiation has a wavelength from about 0.01 nm to about 15 nm. In embodiments, the spin isolated beam of monochromatic electromagnetic radiation has a wavelength is from about 2 nm to about 8 nm. In embodiments, the spin isolated beam of monochromatic electromagnetic radiation has a wavelength from about 15 nm to about 50 nm. In embodiments, the spin isolated monochromatic electromagnetic beam has a wavelength from about 100 nm to about 800 nm.

In embodiments, a variable and/or tunable wavelength source is used to produce the monochromatic electromagnetic beam.

FIG. 7 depicts a spin-isolated monochromatic electromagnetic beam 700 according to embodiments disclosed herein, consisting essentially of a plurality of spin-isolated photons depicted as dashes, wherein the spin-isolated photons are only observable within a plurality of first discrete ranges 702 along a path of the monochromatic electromagnetic beam 700, each of the first discrete ranges 702 is centered at a corresponding distance from a source 704 of the monochromatic electromagnetic beam, wherein essentially no photons are observable within a plurality of second discrete ranges 706 located in-between each of the first discrete ranges 704.

In embodiments, the first discrete ranges 702 wherein the spin-isolated photons are observable, have a length 708 of less than or equal to about 10 nm. In embodiments, the first discrete ranges wherein the spin-isolated photons are observable have a length of less than or equal to about 1 nm. In embodiments, an average length 708 of the first discrete ranges is essentially equal to an average length of the second discrete ranges 710 in which essentially no photons are observable.

In embodiments, delivering only photons of the same type, in so eliminating both the physics-spin interference/cancellation; and a polarity latitude interference/cancellation. Sequencing the photon delivery allows for systematically covering all physical regions, not with random waves, but with relative delivery at radial distances based upon a target area. In embodiments, the method of contacting for a period of time, and at a temperature, a portion of an uncured layer of a polymeric composition disposed over a substrate with a spin isolated beam of monochromatic electromagnetic radiation includes movement of the target (the substrate), movement of the source of photons, adjustment of the path length between the source and the substrate including, but not limited to mirrors, magnetic fields, and the like. Accordingly, methods disclosed herein may systematically activate and cure the photoresist thereby eliminating random events which are dilatory to the goal.

While the foregoing is directed to embodiments of the present disclosure, other and further embodiments of the disclosure may be devised without departing from the basic scope thereof.

The invention claimed is:

1. A method comprising:

contacting for a period of time, and at a temperature, a portion of an uncured layer of a polymeric composition disposed over a substrate with a spin isolated beam of monochromatic electromagnetic radiation having a wavelength and an intensity sufficient to activate and at least partially cure the portion of the polymeric composition;

wherein the spin isolated beam of monochromatic electromagnetic radiation consists essentially of a plurality of spin isolated photons, wherein the spin isolated photons are only observable within a plurality of first discrete ranges along a path of the spin isolated beam of monochromatic electromagnetic radiation, each of the first discrete ranges centered at a corresponding distance from a source of the spin isolated beam of monochromatic electromagnetic radiation, wherein essentially no photons are observable within a plurality of second discrete ranges located in-between each of the first discrete ranges along the path of the spin isolated beam of monochromatic electromagnetic radiation.

2. The method of claim 1, wherein the spin isolated beam of monochromatic electromagnetic radiation is linearly polarized, circularly polarized, elliptically polarized, or a combination thereof.

3. The method of claim 1, wherein the spin isolated beam of monochromatic electromagnetic radiation is configured such that only photons having a positive spin are present within a plurality of particular first discrete ranges N, and only photons having a negative spin are present within a plurality of second discrete ranges (N+1) along the path of the spin isolated beam of monochromatic electromagnetic radiation.

4. The method of claim 1, wherein the spin isolated monochromatic electromagnetic beam is directed through, or reflected off of a mask, configured to activate only a portion of the polymeric composition disposed over the substrate.

5. The method of claim 1, wherein a distance between a source of the spin isolated beam of monochromatic electromagnetic radiation and the substrate is selected such that photons generated by multiple photon sources present within the source each having the same spin, are present within a particular first discrete range centered at a particular discrete location along the path of the spin isolated beam of monochromatic electromagnetic radiation, such that only a portion of the polymeric composition which is present on a surface of the substrate at the particular discrete location is activated and cured.

6. The method of claim 1, wherein the contacting the portion of the uncured layer of the polymeric composition further comprises contacting a first portion of the uncured polymeric composition with the spin isolated beam of monochromatic electromagnetic radiation to activate and cure a first portion of the polymeric composition, followed by changing a distance between the source of the spin isolated beam of monochromatic electromagnetic radiation and the substrate, followed by contacting a second portion of the uncured layer of the polymeric composition with the spin isolated beam of monochromatic electromagnetic radiation to activate and cure a second portion of the polymeric composition.

7. The method of claim 1, wherein the spin isolated beam of monochromatic electromagnetic radiation has a wavelength from about 0.01 nm to about 800 nm.

8. The method of claim 1, wherein the spin isolated beam of monochromatic electromagnetic radiation has a wavelength from about 0.01 nm to about 15 nm.

9. The method of claim 1, wherein the spin isolated beam of monochromatic electromagnetic radiation has a wavelength is from about 2 nm to about 8 nm.

10. The method of claim 1, wherein the spin isolated beam of monochromatic electromagnetic radiation has a wavelength from about 15 nm to about 50 nm.

11. The method of claim 1, wherein spin isolated monochromatic electromagnetic beam has a wavelength from about 100 nm to about 800 nm.

12. The method of claim 1, wherein each of the plurality of first discrete ranges along the path of the spin isolated beam of monochromatic electromagnetic radiation has a length of less than or equal to about 10 nm.

13. The method of claim 1, wherein each of the plurality of first discrete ranges along the path of the spin isolated beam of monochromatic electromagnetic radiation has a length of less than or equal to about 1 nm.

14. The method of claim 1, wherein each of the plurality of second discrete ranges along the path of the spin isolated beam of monochromatic electromagnetic radiation has a length essentially equal to a length of each of the plurality of first discrete ranges along the path of the spin isolated beam of monochromatic electromagnetic radiation.

15. The method of claim 1, wherein the spin isolated beam of monochromatic electromagnetic radiation is produced by directing a monochromatic electromagnetic radiation beam having the wavelength through one or more spin isolation filters.

16. The method of claim 15, wherein the spin isolation filter comprises a magnetic spin isolation filter, comprising:

a beam inlet separated from a beam outlet along a beam path disposed between a first magnet and a second magnet, wherein the beam path is oriented through a non-uniform magnetic field disposed between the first magnet having a first cross section oriented perpendicular to the beam path and a second magnet having a second cross section oriented perpendicular to the beam path which is different than the first cross section, the first magnet and second magnet configured such that the beam path between the beam inlet and the beam outlet of the magnetic spin isolation filter transverses a non-uniform magnetic field;

the first magnetic and the second magnet having a strength and the beam path having a length sufficient to separate the monochromatic electromagnetic radiation beam into a pair of spin isolated beam of monochromatic electromagnetic radiation, each independently emanating from different portions of the beam outlet; and wherein the method further includes directing the monochromatic electromagnetic radiation beam having the wavelength through the beam inlet under conditions sufficient to produce the spin isolated beam of monochromatic electromagnetic radiation emanating from the beam outlet.

17. A method comprising:

contacting for a period of time, and at a temperature, a portion of an uncured layer of a polymeric composition disposed over a substrate with a spin isolated beam of monochromatic electromagnetic radiation having a wavelength and an intensity sufficient to activate and at least partially cure the portion of the polymeric composition;

wherein the spin isolated beam of monochromatic electromagnetic radiation consists essentially of a plurality of spin isolated photons, wherein the spin isolated photons are only observable within a plurality of first discrete ranges along a path of the spin isolated beam of monochromatic electromagnetic radiation, each of the first discrete ranges centered at a corresponding distance from a source of the spin isolated beam of monochromatic electromagnetic radiation, wherein essentially no photons are observable within a plurality of second discrete ranges located in-between each of the first discrete ranges along the path of the spin isolated beam of monochromatic electromagnetic radiation;

wherein the spin isolated beam of monochromatic electromagnetic radiation is produced by directing a monochromatic electromagnetic radiation beam having the wavelength through one or more spin isolation filters;

wherein the spin isolation filter comprises a double slit-single slit spin isolation filter comprising two coplanar slits disposed through a first wave barrier, and a second single slit disposed through a second wave barrier spaced away from first wave barrier along a path of the monochromatic electromagnetic radiation beam through the spin isolation filter, wherein each of the two coplanar slits have a slit width(S);

wherein the two coplanar slits are separated center-on-center by a slit distance (d);

and wherein the method includes:

directing at least a portion of the monochromatic electromagnetic radiation beam through the two coplaner slits, and directing a portion of the monochromatic electromagnetic beam emanating from one of the two coplanar slits through the second single slit disposed through the second wave barrier oriented parallel to the first wave barrier, to form the spin isolated beam of monochromatic electromagnetic radiation emanating from the second single slit;

wherein the second wave barrier is located a barrier distance D from the first wave barrier along the path of the beam, wherein D=((n/2)/d)* the wavelength; and wherein n is an odd integer divided by 2 (n/2).

18. The method of claim 17, wherein the slit distance (d) is greater than or equal to about eight times the slit width S according to the equation:

$$d=8S\pm5\%.$$

19. The method of claim 17, wherein an intensity of the spin isolated beam of monochromatic electromagnetic radiation contacting the portion of the uncured layer of the polymeric composition d is essentially equal in intensity to the intensity of the spin isolated beam of monochromatic electromagnetic radiation emanating from the second single slit.

20. A substrate comprising an uncured portion and a cured portion of a layer of a polymeric composition disposed over the substrate, wherein the portion of cured portion of the layer of the polymeric composition is formed by contacting the portion of the polymeric composition for a period of time and at a temperature with a spin isolated beam of monochromatic electromagnetic radiation having a wavelength and an intensity sufficient to activate and at least partially cure the portion of the polymeric composition;

wherein the spin isolated beam of monochromatic electromagnetic radiation consists essentially of a plurality of spin isolated photons, wherein the spin isolated photons are only observable within a plurality of first discrete ranges along a path of the spin isolated beam of monochromatic electromagnetic radiation, each of the first discrete ranges centered at a corresponding distance from a source of the spin isolated beam of monochromatic electromagnetic radiation, wherein essentially no photons are observable within a plurality of second discrete ranges located in-between each of the first discrete ranges along the path of the spin isolated beam of monochromatic electromagnetic radiation.

* * * * *